(12) United States Patent
Kothandaraman

(10) Patent No.: US 7,042,094 B2
(45) Date of Patent: May 9, 2006

(54) VIA STRUCTURE FOR SEMICONDUCTOR CHIP

(75) Inventor: Chandrasekharan Kothandaraman, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 8 days.

(21) Appl. No.: 10/771,000

(22) Filed: Feb. 2, 2004

(65) Prior Publication Data

US 2005/0167840 A1     Aug. 4, 2005

(51) Int. Cl.
 *H01L 23/48* (2006.01)
 *H01L 23/52* (2006.01)
 *H01L 29/40* (2006.01)

(52) U.S. Cl. ..................... 257/758; 257/508

(58) Field of Classification Search ............... 257/690, 257/691, 692, 663, 734, 774, 773, 508, 622, 257/698, 758, 759, 760; 438/637
See application file for complete search history.

(56) References Cited

U.S. PATENT DOCUMENTS 6,236,114 B1 *   5/2001   Huang et al. ............... 257/758
6,667,552 B1 * 12/2003   Buynoski .................... 257/758

* cited by examiner

*Primary Examiner*—Hoai Pham
*Assistant Examiner*—Dana Farahani
(74) *Attorney, Agent, or Firm*—Brinks Hofer Gilson & Lione

(57) ABSTRACT

A multi-level via structure for a semiconductor chip in which the collective area of a vias structure is not entirely oriented directly in-line with the collective area of an adjacent vias structure. In one embodiment, adjacent via structure areas appear to be crisscrossed in relation to one another and in another embodiment adjacent via structure areas do not coincide at all from a perpendicular perspective.

12 Claims, 4 Drawing Sheets

VIA STRUCTURE FOR SEMICONDUCTOR CHIP

BACKGROUND OF THE INVENTION

1. Technical Field of the Invention

The invention relates generally to the field of integrated circuits and, more particularly, to via structures in integrated circuits.

2. Description of Related Art

Over the last few decades, the electronics industry has developed semiconductor technology to fabricate small, highly integrated electronic devices. Much of recent technological progress embraces the increasing miniaturization afforded by advances in integrated circuit processing technology. Dramatic improvements in the circuit density available on individual integrated circuit chips have been made.

Many semiconductor devices are now formed by vertical stacking of device layers, including multiple layers of conductive lines with interconnects between the layers. These conductive lines and interconnects are typically formed using metals, including, for example, aluminum, tungsten, and copper.

In a multilevel architecture, layers of conductive lines which define circuit pathways are separated from each other by interlevel dielectrics. In a typical fabrication of a modern semiconductor device, a first conductive layer is deposited and patterned over a semiconductor surface. Then, a layer of dielectric, such as silicon dioxide, is deposited over the patterned conductive layer. Typically, the silicon dioxide is planarized to provide a flat surface. The planarized dielectric is then patterned to form vias. Vias are holes through the dielectric used for interconnecting the different conductive layers of the semiconductor circuit. The vias are filled with a conductive material such that another layer of conductive material can be deposited over the vias and the dielectric to provide an upper conductive pattern. Copper has become the preferred via material because of its excellent conductivity and current capacity, however copper requires a distinct adhesive layer, such as chromium, to bond the copper to the dielectric. For this reason, aluminum is sometimes used because it readily bonds with dielectrics without an intermediate adhesive layer.

Subsequent conductive layers are deposited over corresponding dielectric material layers which are provided with corresponding vias to form an interconnect pattern for an integrating circuit.

Generally, on the periphery of such integrated circuits, very large areas are etched in the silicon dioxide to form bond pads. Vias are also used in the formation of the bond pads which are typically used to interconnect, for example, wire bonds to an integrated circuit. These bond pad vias are also filled with a conductive material such that the wire bonds can be coupled over the vias to provide a conductive coupling to the chip.

Typically, integrated circuit chips are individually packaged and the packages are mounted on printed circuit boards. The sizes of the packages limit chip density on the printed circuit board, requiring larger systems and limiting overall circuit performance due to longer inter-chip connections. More recently, multi-chip carriers have been developed which permit multiple integrated circuit chips to be mounted on a common carrier without the need for packaging the individual chips. This allows the chips to be packed more closely together.

While multi-chip carriers have been fabricated using a variety of technologies, the greatest chip density has been achieved by multi-chip carriers fabricated using the above-mentioned integrated circuit processing technology. In other words, a multi-chip carrier can be fabricated by defining multiple layers of circuits interconnected by metal vias through intermediate dielectric layers. Individual integrated circuit chips are attach to the upper layer of the multi-chip carrier and transceive electrical signals through the multi-chip carrier's circuit layers and vias.

High conductivity of the interconnects of the conductive layers of an integrated circuit and bonding of the integrated circuit is important for the efficient operation of such a circuit, particularly at submicron technologies. One of the problems with typical via structures, particularly with wire-bond pads, is poor bondability due to size reduction and lack of rigidity associated with conventional via arrangements. The connection between the pad and the bonding wire is performed by "wire bonding", which connects metal materials by pressing one to the other while using pressure, heat and ultrasonic vibration simultaneously. A copper or gold wire, for example, supplied through a capillary is balled by heating and the ball is pressed and connected to the pad while applying ultrasonic vibration.

When the wire is mechanically pressed to the pad in order to perform the thermosonic wire bonding, there is a possibility that the pressing force is propagated to a connecting portion between the pad and the underlying layer where the connecting portion can be damaged. This phenomenon does not cause a substantial problem if the size of the pad is relatively large. However, when the size of the pads are reduced with reduction of the size of semiconductor element and increase of the integration density, the size of the ball formed on the top of the wire must be reduced. Therefore, stress exerted on a unit area of the pad is increased, so that breakage and damage of the pad and the underlying insulating film tend to occur. This problem may cause the pad to be easily torn, resulting in reduction of fabrication yield of semiconductor device.

An improved via structure which enhances the rigidity of the structure without altering the ratio of via area to total chip area would therefore be advantageous.

SUMMARY OF THE INVENTION

The present invention achieves technical advantages as an apparatus and system for multi-layer interconnect in a semiconductor chip. A multilevel via structure is provided within the chip such that the collective area of the vias for each layer are not entirely arranged directly in-line with the collective area of the vias of adjacent layers. In one embodiment, adjacent via areas appear to be crisscrossed in relation to one another and in another embodiment adjacent via areas do not overlap at all. The via structure enhances the rigidity of the wire-bond pad without increasing the via area to chip area ratio or increasing the total via area. The increased rigidity realized from the via arrangement improves bondability during wire-bonding and improves lateral stability which provides protection from "wire-pull".

BRIEF DESCRIPTION OF THE DRAWINGS

For a more complete understanding of the present invention, reference is made to the following detailed description taken in conjunction with the accompanying drawings wherein.

DETAILED DESCRIPTION

Figure 1A:
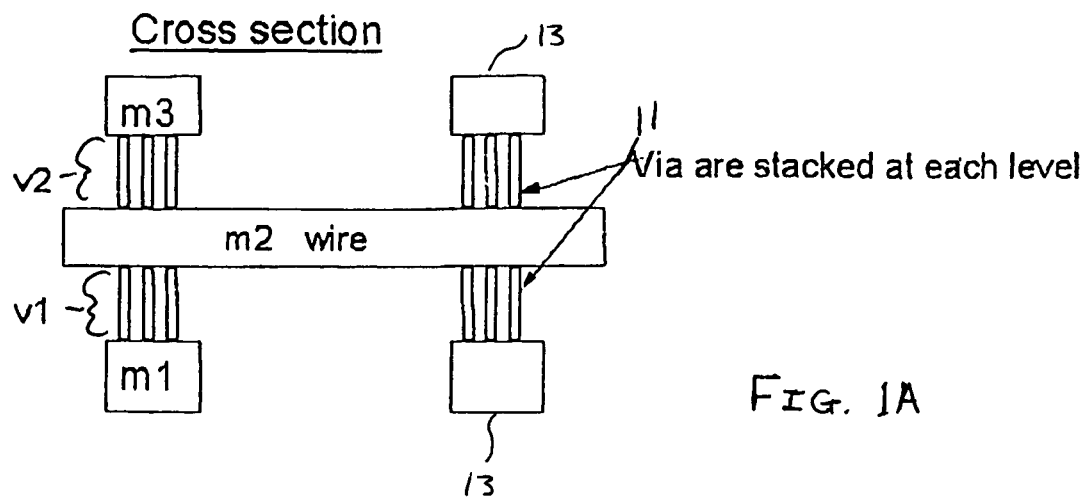
FIG. 1A illustrates a cross section of a conventional stacked via arrangement.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed descriptions of known functions and constructions unnecessarily obscuring the subject matter of the present invention have been omitted for clarity.

In accordance with exemplary embodiments of the present invention, a via structure is described which enhances rigidity, particularly for a wire bond structure, for improved bondability in integrated circuits. The via structure is hereinafter discussed in terms of a wire bond structure, however, it should be noted that it can also be implemented as interconnects for the conductive layers of an integrated circuit.

Referring now to FIG. 1A there is illustrated a cross section of a conventional stacked via arrangement. The via stacks 11 couple metal layers in which the metal layers can be internal metal layers or metal pads 13. There is shown only two via stacks (V1 and V2), however there can be more than two. As shown, V1 couples metal layer M1 (which is shown here as a pad) and M2 (which is shown here as an internal metal wire), and V2 couples M3 (which is shown here as a pad) and M2. Conventionally, each via stack includes several vias arranged in a symmetrical pattern and are stacked directly on top of one another.

Figure 1B:
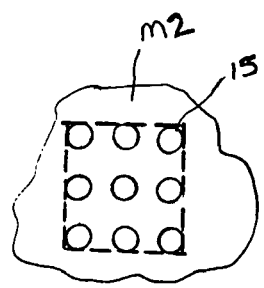
FIG. 1B illustrates a top view of the via stacks illustrated in FIG. 1A from the prospective of the M3 metal layer.

Referring now to FIG. 1B there is shown a top view of the via stacks V1, V2 illustrated in FIG. 1A from the prospective of the M3 metal layer. The via stack includes nine vias arranged in a square 15. The vias 11 of via stack V1 are arranged directly below the M2 metal layer in the same position (i.e., within the same area 15) as the vias 11 of via stack V2. There can be more or less than nine vias and some other defined area, but what is important to note is that conventionally the vias of each layer are stacked in the same arrangement and/or area directly on top of one another such that it appears from a cross-sectional view to be a single column.

Figure 2A:
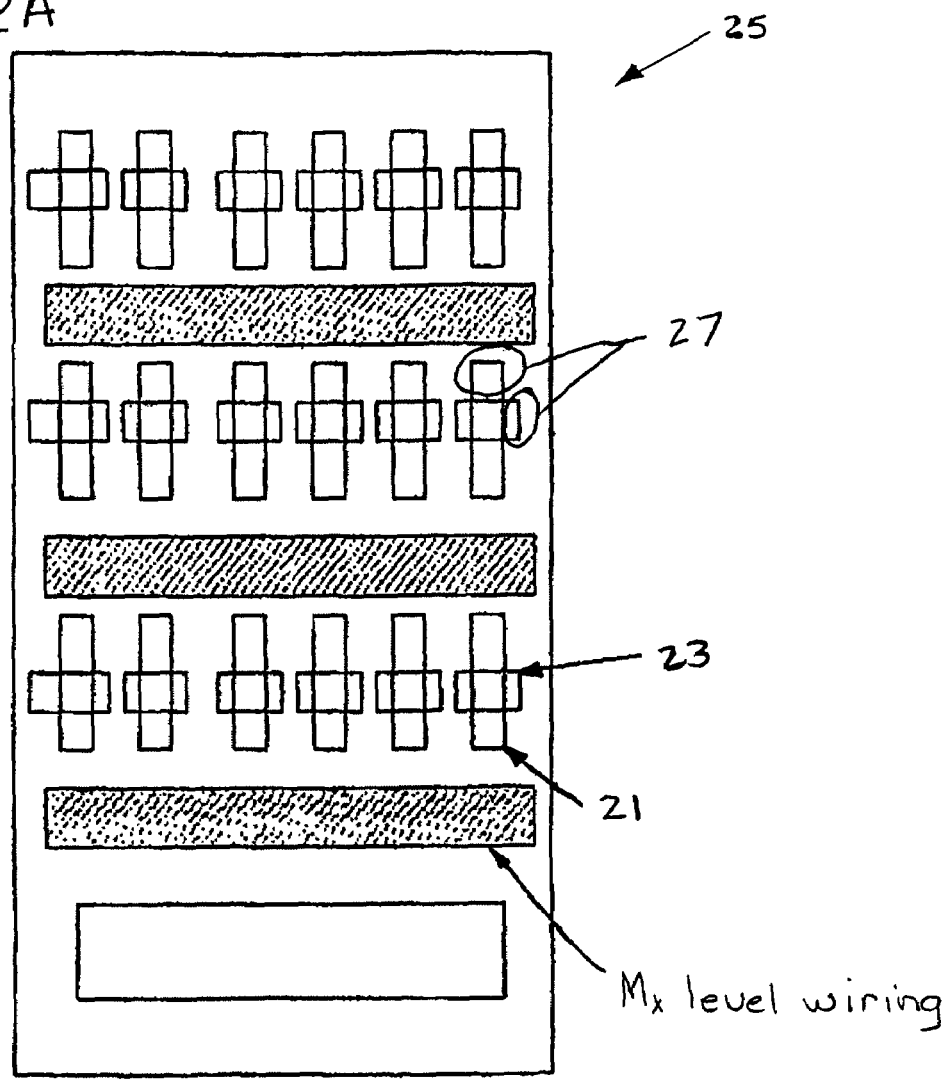
FIG. 2A shows a top view of a chip illustrating a via arrangement in accordance with exemplary embodiments of the present invention.

Referring now to FIG. 2A there is shown a top view of a chip 25 illustrating a via arrangement in accordance with exemplary embodiments of the present invention. From above, the via stack areas 21, 23 of two different layers appear as a crisscrossed bar or multilevel "via-bar" configuration in which the via stacks are not entirely formed in areas one on top to the other. Although a portion of the via stack areas 21, 23 are common, portions of each via stack protrudes outside the via stack area of the other (as identified by 27). In this exemplary embodiment, the area 21, 23 of each via stack is rectangular when viewed from above though other defined shapes are contemplated. The multilevel via-bar according to the present invention enhances the rigidity of the wire bond pad and via stack areas can be chosen which do not increase the via area to chip area ratio or increase the total via area. The increased rigidity improves bondability during wire-bonding and improves lateral stability which provides protection from "wire-pull".

Figure 2B:
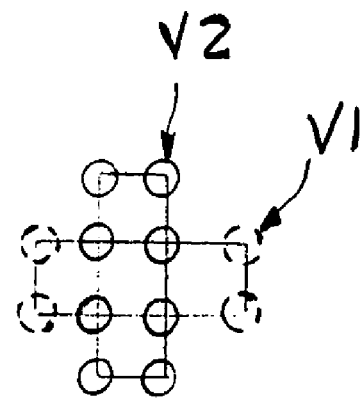
FIG. 2B shows a top view illustration of the via stacks identified in FIG. 2A.
Figure 2C:
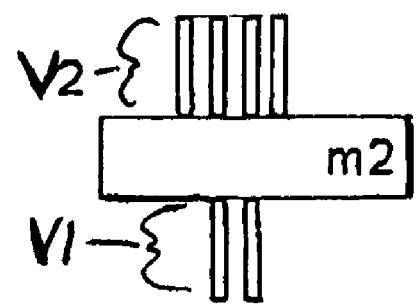
FIG. 2C shows a cross section illustration of the via stacks identified in FIG. 2A.

An example of such an arrangement is shown is FIGS. 2B and 2C. FIG. 2B is a top view of the V1 and V2 via stacks identified in FIG. 2A as areas 23 and 21 respectively, and FIG. 2C is a cross sectional view of the V1 and V2 via stacks. For any additional via stack layers, the next via stack is oriented such that it appears as a crisscrossed bar (when viewed from above) with respect to any adjacent via stack layer. Further, to maintain the via stack area of a conventional via stack (such as that illustrated in FIG. 1B) each rectangular area is calculated to be approximately that of the area formed by the conventional via stack. In at least one exemplary embodiment it is preferable to have symmetric via areas on each layer for process optimization. That is, each via area shape is the same though each is oriented at 90 degrees with respect to adjacent stacks (as shown in FIG. 2).

Figure 3:
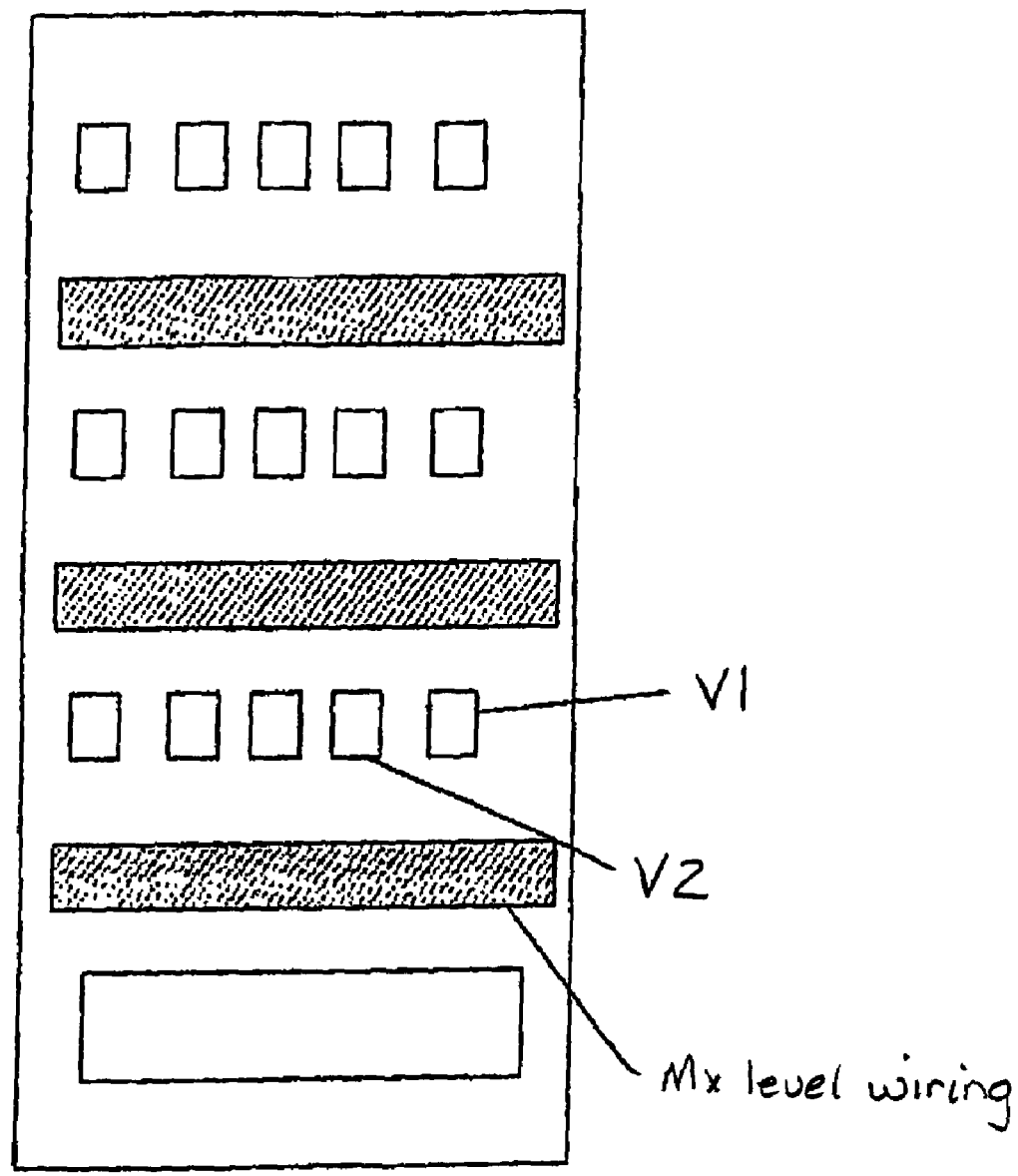
FIG. 3 illustrates a top view of another via structure arrangement in accordance with an exemplary embodiment of the present invention.

Referring now to FIG. 3 there is shown another embodiment of a via stack arrangement in accordance with exemplary embodiments of the present invention in which the via stack areas for each layer are symmetrical on each layer (as shown in the conventional approach of FIG. 1) and oriented in the same manner, but are staggered with respect to adjacent layers such that adjacent via stack layers do not overlap at all when view from above. This new arrangement enables all via stacks areas to be symmetrical and have the same orientation. Here, rigidity in the via area portions of the chip 25 is also enhanced improving bondability during wire-bonding and improving lateral stability which provides added protection from "wire-pull".

Although a preferred embodiment of the method and system of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A structure for connecting stacked conductive components of an integrated chip, comprising:
   a first conductive layer;
   a second conductive layer in a substantially parallel plane with said first conductive layer;
   a first dielectric layer formed between said first and second conductive layers;
   a third conductive layer in a substantially parallel plane with said second conductive layer;
   a second dielectric layer formed between said second and third conductive layers;
   a first via structure formed in said first dielectric layer and substantially perpendicular to said first and second conductive layers for providing a conductive path therebetween, the first via structure including a plurality of vias defining a first group of vias and arranged in a first area; and a second via structure formed in said second dielectric layer and substantially perpendicular to said second and third conductive layers for providing a conductive path therebetween and arranged such that portions of said second via structure lie outside an area defining said first via structure, the second via structure including a plurality of vias defining a second group of vias and arranged in a second via area, the first via area and the second via area having a substantially similar oblong shape with a major dimension, the centers of the oblong shapes being substantially aligned and the major axis of the first via area being offset by approximately 90 degrees to the major axis of the second via area such that only portions are overlapping and forming a crisscross pattern.

2. The structure of claim 1, wherein said second via structure is further arranged such that substantially all portions of the second via area lie outside an area defining said first via area.

3. The structure of claim 1, wherein each of said first via structure and said second via structure comprise a common number of vias arranged in identical patterns such that each pattern determines an area in a plane perpendicular with said vias.

4. The structure of claim 3, wherein each of said first via area and said second via area are symmetrical with respect to each other and arranged in said respective dielectric layers such that only portions overlap from a perpendicular perspective.

5. The structure of claim 3, wherein each of said first via area and said second via area are rectangular and oriented on a center line such that only a portion of said rectangular areas of said first and second via structures share a common perpendicular path between said conductive layers.

6. The structure of claim 1, wherein said first via structure comprises a plurality of groups of vias, each via group is arranged in an identical pattern, said second via structure comprises a corresponding plurality of groups of vias each arrange in said pattern.

7. The structure of claim 1, wherein said first via structure comprises a plurality of groups of vias, each via group is arranged in an identical pattern defining an area, said second via structure comprises a corresponding plurality of groups of vias each arrange in said pattern, corresponding via areas of said first via structure and said second via structure are oriented such that only portions are overlapping from a perpendicular perspective.

8. The structure of claim 7, wherein said first via structures via areas and said second via structure via areas are rectangular and corresponding via areas are oriented in a crisscross arrangement.

9. The structure of claim 1, wherein said first conductive layer is a metallic bonding pad for said integrated chip.

10. A via structure for coupling a plurality of stacked conductive layers separated by dielectric layers in an integrated chip, comprising:
 a first structure comprising a plurality of vial having a pattern defining an area and formed in a dielectric layer for providing a conductive path between adjacent conductive layers; and
 a second structure comprising a plurality of vias having a pattern defining an area and formed in a further dielectric layer for providing a conductive path between further adjacent conductive layers, wherein said dielectric layer and said further dielectric layer are adjacent dielectric layers, and further wherein said adjacent conductive layers and said further adjacent conductive layers have a common conductive layer; and
 said plurality of vias of the first structure and said plurality of vias of the second structure arranged in a substantially similar oblong shape having an orientation such that centers of the oblong shapes are substantially aligned and portions of said first structure area lie outside said second structure area from a perpendicular perspective where only portions of the area are overlapping and forming a crisscross pattern.

11. The via structure of claim 10, wherein said first structure and said second structure have a further orientation such that substantially all portions of said first structure area lie outside said second structure area.

12. The via structure of claim 10, wherein each of said first structure area and said second structure area are rectangular and have a crisscross orientation with respect on one another.

* * * * *

UNITED STATES PATENT AND TRADEMARK OFFICE
CERTIFICATE OF CORRECTION

PATENT NO. : 7,042,094 B2 Page 1 of 1
APPLICATION NO. : 10/771000
DATED : May 9, 2006
INVENTOR(S) : Chandrasekharan Kothandaraman It is certified that error appears in the above-identified patent and that said Letters Patent is hereby corrected as shown below:

Column 6, in claim 10, line 4, after "a plurality of" delete "vial" and substitute --vias-- in its place.

Signed and Sealed this

Twentieth Day of March, 2007

JON W. DUDAS
*Director of the United States Patent and Trademark Office*